（12）United States Patent
Portmann

(10) Patent No.: US 6,169,434 B1
(45) Date of Patent: Jan. 2, 2001

(54) CONVERSION CIRCUIT WITH DUTY CYCLE CORRECTION FOR SMALL SWING SIGNALS, AND ASSOCIATED METHOD

(75) Inventor: Clemenz L. Portmann, Cupertino, CA (US)

(73) Assignee: Rambus Inc., Mountain View, CA (US)

( * ) Notice: Under 35 U.S.C. 154(b), the term of this patent shall be extended for 0 days.

(21) Appl. No.: 09/146,286

(22) Filed: Sep. 3, 1998

Related U.S. Application Data

(60) Provisional application No. 60/057,900, filed on Sep. 5, 1997.

(51) Int. Cl.[7] .......................... H03K 3/017; H03K 5/04; H03K 7/08
(52) U.S. Cl. ................................ 327/175; 327/51
(58) Field of Search ........................ 327/54–57, 65–67, 327/175, 172; 365/205, 206, 207

(56) References Cited

U.S. PATENT DOCUMENTS 5,696,724 * 12/1997 Koh et al. .............................. 365/205
5,696,726 * 12/1997 Tsukikawa ............................. 365/205

* cited by examiner

Primary Examiner—Terry D. Cunningham
Assistant Examiner—Quan Tra
(74) Attorney, Agent, or Firm—Pennie & Edmonds LLP

(57) ABSTRACT

A duty cycle correcting amplifier includes a first differential transistor pair with a pair of input nodes for receiving a differential input signal to be amplified. The first differential transistor pair has a first common node and a first pair of output nodes carrying differential output signals. A first current source is connected between the first common node and a first supply voltage. A second differential transistor pair has a pair of input nodes for receiving differential error input signals. The second differential transistor pair has a second common node and a second pair of output nodes coupled to the first pair of output nodes. The second differential transistor pair alters the common mode levels of each of the first pair of output nodes based on the differential error input signals to affect the duty cycle of the differential output signals. A second current source is connected between the second common node and the first supply voltage. A load circuit is connected between the first pair of output nodes and a second supply voltage. The load circuit provides a high impedance load between each node of the first pair of output nodes and a low impedance between each node of the first pair of output nodes and the second supply voltage. Capacitive circuitry is connected to each node of the first pair of output nodes. A converting amplifier has a pair of inputs for receiving the differential output signals. The converting amplifier amplifies and converts the differential output signals to a single ended signal constituting the output of the duty cycle correcting amplifier.

9 Claims, 4 Drawing Sheets

CONVERSION CIRCUIT WITH DUTY CYCLE CORRECTION FOR SMALL SWING SIGNALS, AND ASSOCIATED METHOD

This application claims priority to the U.S. Provisional Application entitled "Small-Swing to CMOS Conversion Circuit with Duty Cycle Correction", Ser. No. 60/057,900 filed Sep. 5, 1997.

BACKGROUND OF THE INVENTION

1. Field of the Invention

The present invention relates to the field of integrated circuits. More particularly, the present invention relates to integrated circuit interfaces that facilitate high-speed clocking and data transmission.

2. Description of the Related Art

High-speed clocking is a goal in many digital systems. For example, high speed clocking is important in achieving high-speed data buses used with microprocessors, memories (e.g., DRAM, SRAM, Flash devices), and ASICs. These high-speed clocks may be small signal clocks with voltage swings of, for example, 400 mV to 600 mV. Further, the duty cycle of the clock signal may not be 50% because of imperfect clock sources, parasitics on or coupled to a clock bus, other integrated circuits in the clock path, and many other factors.

An integrated circuit receives the high-speed clock and uses it to synchronize its operation. In order to use the signal internally within a CMOS integrated circuit, it is frequently necessary to convert a small signal clock to CMOS levels, which typically range from ground to VCC ("full-rail"). In order to enhance predictability and allow greater performance margins, the clock signal should have a 50% duty cycle. A 50% duty cycle means that in a single cycle the digital high signal has the same duration as the digital low signal. In a clocking scheme where both rising and falling edges of the clock signal are used for clocking, a 50% duty cycle is critical in improving performance margins.

In view of the foregoing, it would be highly desirable to provide an apparatus and method for improved processing of small swing signals. Ideally, such a technique would include the capability to perform duty cycle correction.

SUMMARY OF THE INVENTION

A duty cycle correcting amplifier includes a first differential transistor pair with a pair of input nodes for receiving a differential input signal to be amplified. The first differential transistor pair has a first common node and a first pair of output nodes carrying differential output signals. A first current source is connected between the first common node and a first supply voltage. A second differential transistor pair has a pair of input nodes for receiving differential error input signals. The second differential transistor pair has a second common node and a second pair of output nodes coupled to the first pair of output nodes. The second differential transistor pair alters the common mode levels of each of the first pair of output nodes based on the differential error input signals to affect the duty cycle of the differential output signals. A second current source is connected between the second common node and the first supply voltage. A load circuit is connected between the first pair of output nodes and a second supply voltage. The load circuit provides a high impedance load between each node of the first pair of output nodes and a low impedance between each node of the first pair of output nodes and the second supply voltage. Capacitive circuitry is connected to each node of the first pair of output nodes. A converting amplifier has a pair of inputs for receiving the differential output signals. The converting amplifier amplifies and converts the differential output signals to a single ended signal constituting the output of the duty cycle correcting amplifier.

The circuit provides amplification for fixed sized small swing signals. In particular, amplification up to full-rail CMOS levels is achieved. The circuit is low power and has low inherent distortion and process tracking.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DESCRIPTION OF THE PREFERRED EMBODIMENTS

Figure 1:
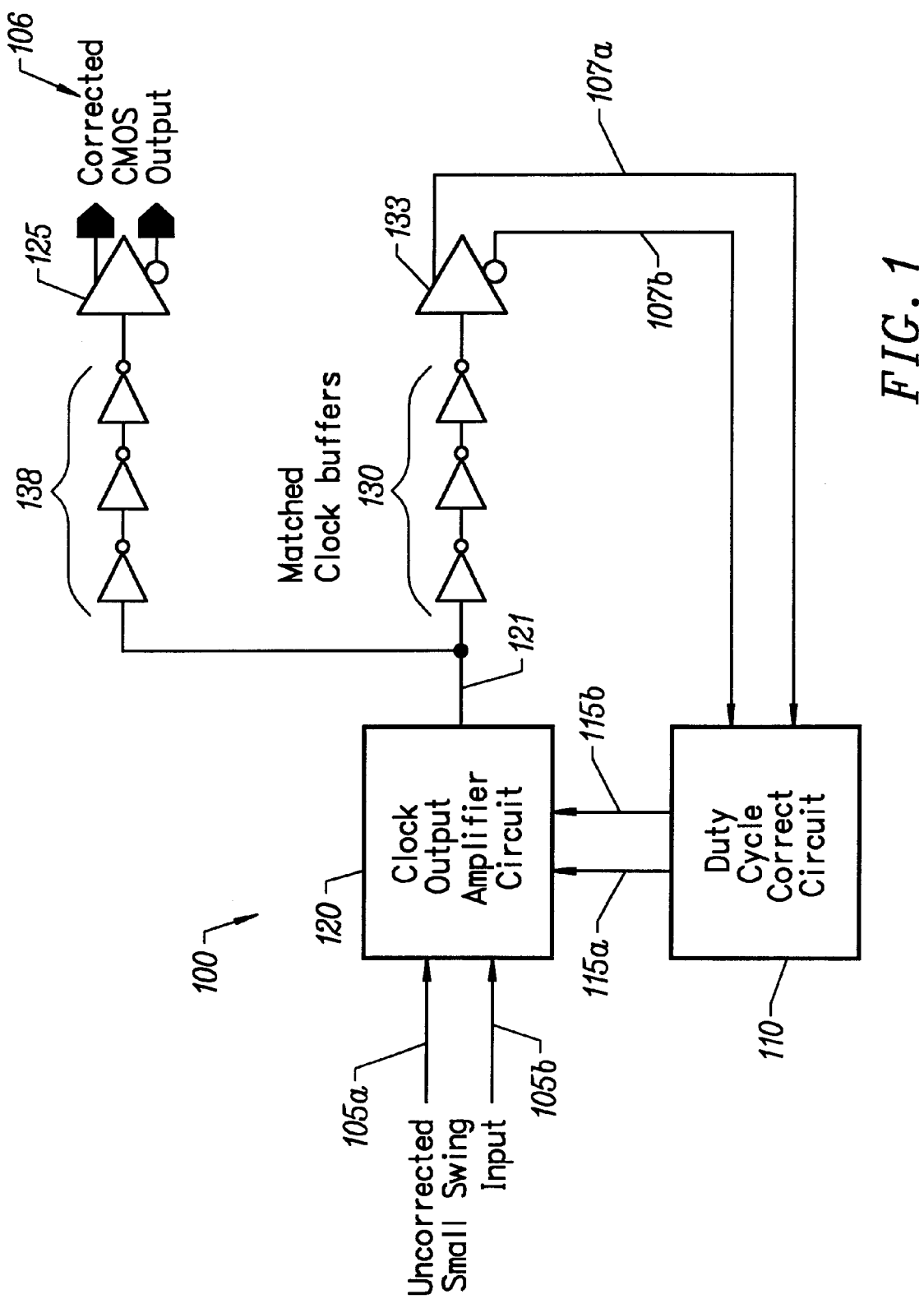
FIG. 1 illustrates the clock output amplifier circuit of the invention along with associated circuitry which in combination form an integrated circuit interface subsystem.

FIG. 1 is a block diagram of an integrated circuit interface subsystem 100 in accordance with an embodiment of the invention. For example, the device 100 may be used in the final stage of an integrated circuit interface with high-speed small-signal clock signals.

The invention is particularly directed toward the clock output amplifier circuit 120. The circuit 120 corrects an external small swing differential input signal with duty cycle distortion, which is received on input lines 105a and 105b. Typically, the input signal is an uncorrected small swing input signal, such as a clock signal. For example, the voltage swing of the input signal may be from about 400 mV to 600 mV. Further, the duty cycle of the signal is not necessarily 50%.

An integrating duty cycle correction circuit 110 is positioned in a feedback path including lines 107a and 107b. The duty cycle correction circuit 110 integrates the error in the feedback clock's duty cycle and produces an error signal, which is applied over lines 115a and 115b to the clock output amplifier circuit 120. The clock output amplifier circuit 120 processes the input signals from lines 105a and 105b and the error signals from lines 115a and 115b to produce a duty cycle corrected and amplified signal, which is applied to output node 121.

In particular, the circuit 120 uses the error signal from the circuit 110 to adjust the output duty cycle. Additionally, the circuit 120 amplifies the signal up to CMOS levels (e.g., having a voltage swing from ground to VCC) to drive an output buffer network 138. A matched clock buffer network 130 and phase splitter 133 provide signals to the feedback loop lines 107a and 107b. The matched clock buffer network 130 matches the output buffer network 138 to generate the corrected CMOS output signal on node 106. A matched clock buffer network 130 is not strictly necessary, but it is desirable to facilitate the disabling of the clock buffer to achieve power savings.

Figure 2:
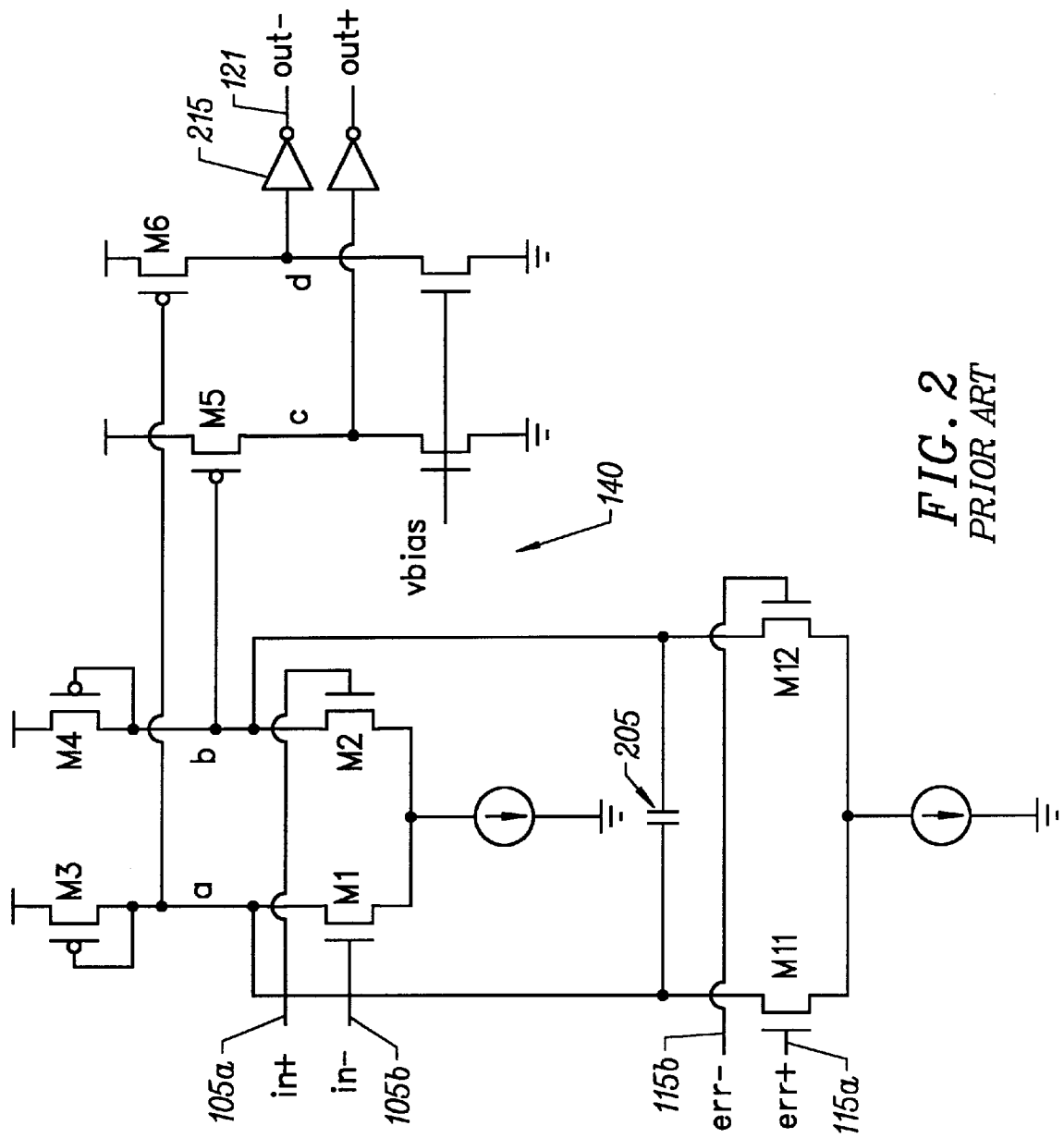
FIG. 2 illustrates a prior art clock output amplifier circuit.

FIG. 2 is a circuit diagram of an implementation for a prior art clock output amplifier circuit 140. This prior art circuit 140 could be used as the clock output amplifier 120 shown in FIG. 1. External input signals are applied to nodes 105a (in+) and 105b (in−). The feedback signal is applied to nodes 115a (err+) and 115b (err−). A capacitor 205 across nodes a and b may be explicitly included or may consist entirely of parasitic capacitances. Capacitor 205 limits the bandwidth of the edge rates of signals at nodes a and b. The circuitry operates by altering the common mode values of the nodes a and b. For bandwidth limited signals, altering the common mode level of node a with respect to node b changes the duty cycle of the resulting differential waveform. P-channel loads M3 and M4, coupled to input pair 105a (in+) and 105b (in−) ensure the loads track p-channel devices M5 and M6 in the final inverters 215 over process skew.

A limitation of the circuit of FIG. 2 is the voltage gain from the input to the internal nodes, c and d. A small-signal voltage gain from the input to nodes c and d can be expressed as:

$$A_v = g_{mn} \cdot R_d$$

where $g_{mn}$ is the transconductance of M1 or M2 and $R_d$ is the small-signal impedance at node d. For a two-stage amplifier, a gain of $g_m R_0$ is quite low. For example, this gain may be 30 or less in modern CMOS technologies with minimum length devices. Thus, nodes c and d may not swing full-rail. Since signals at nodes c and d are single ended, the duty cycle of the output varies with process skew. Additionally, since nodes c and d do not reach full-rail due to the low gain of the input stage, the duty cycle varies with supply noise. The edge rates of the signals at nodes c and d also vary with supply noise, increasing jitter at the output of inverter 215.

Figure 3:
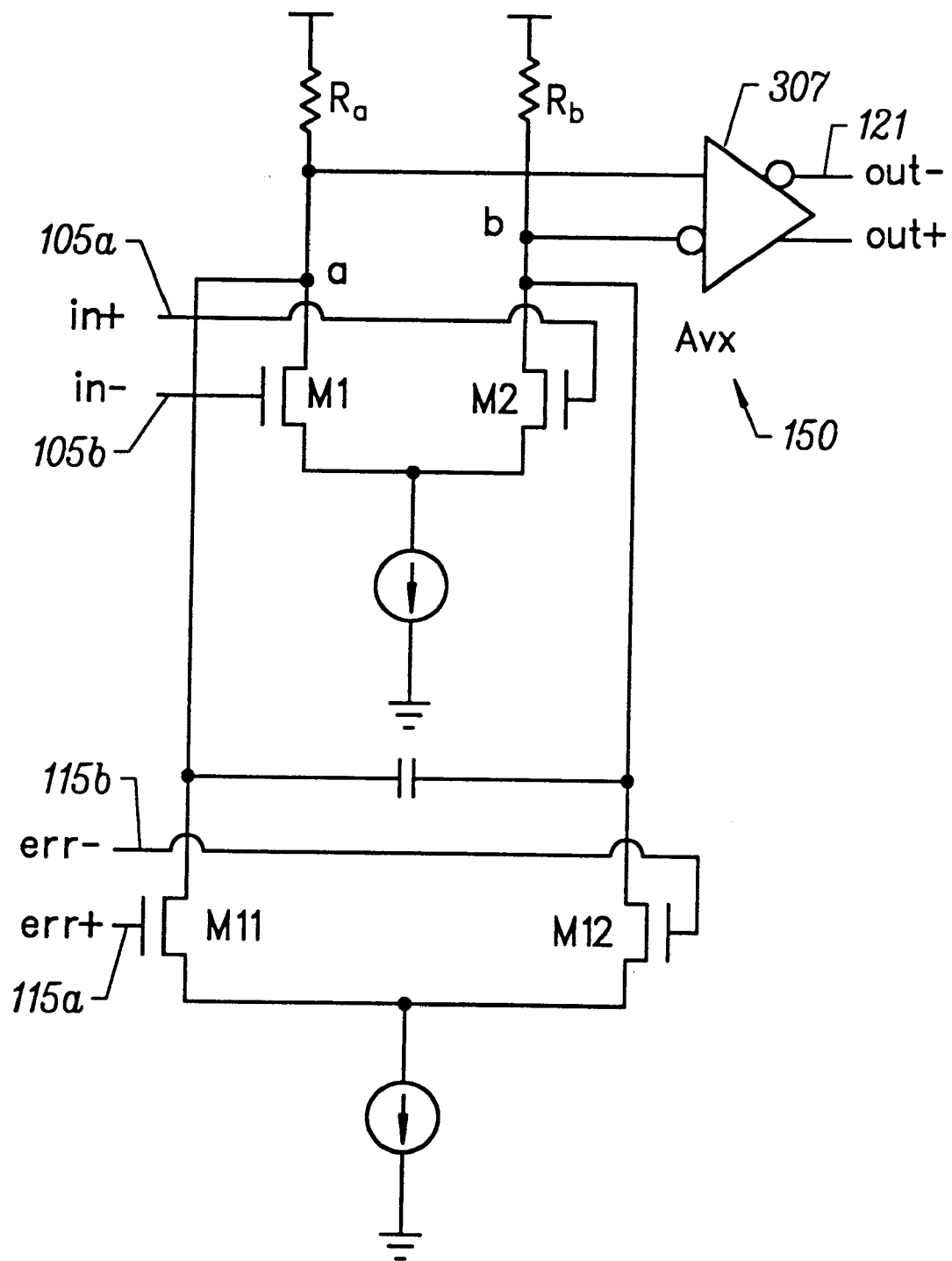
FIG. 3 illustrates a prior art clock output amplifier circuit.

FIG. 3 illustrates another implementation for a prior art clock output amplifier circuit 150. This prior art circuit 150 could also be used as the clock output amplifier 120 shown in FIG. 1. In this implementation, the p-channel loads M3 and M4 of FIG. 2 are replaced with resistor loads $R_a$ and $R_b$, improving the gain of the input stage. An intermediate output at nodes a and b is buffered with a differential voltage amplifier 307. Over process, voltage, and temperature, the resistor skew will generally not correlate with the MOS device skews, and the resistor loads in the input stage may lead to inherent duty cycle distortion in the stage. To overcome this distortion, additional range for the stage is required to correct for the input stage duty cycle distortion, thereby increasing the power for the block. In the circuit of FIG. 3, the output buffer consumes power, and the output signals have to be amplified further with a small-swing to CMOS converter to drive the clock buffer tree, which requires additional power.

Figure 4:
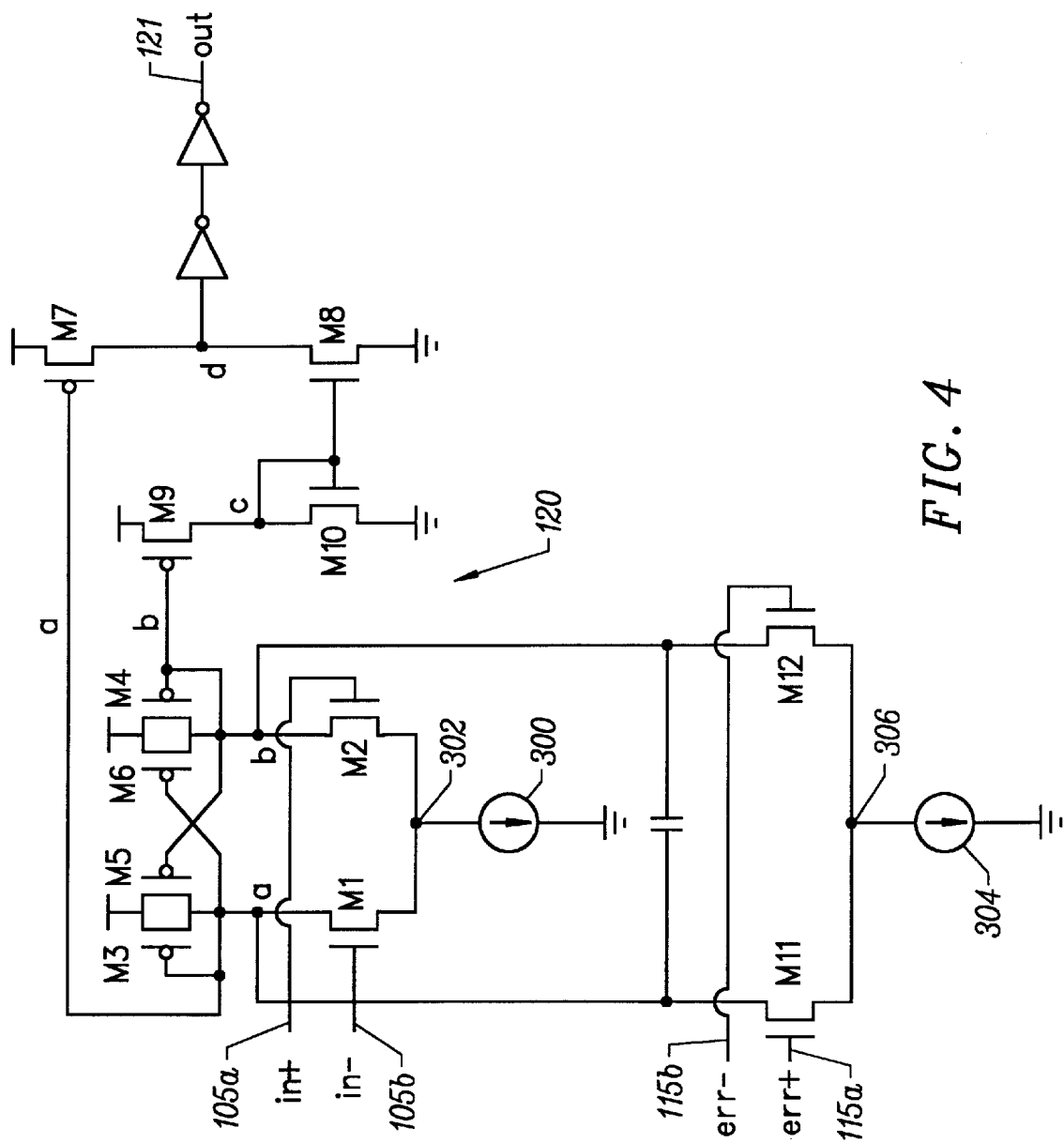
FIG. 4 illustrates a clock output amplifier circuit in accordance with an embodiment of the invention.

FIG. 4 illustrates a clock output amplifier circuit 120 constructed in accordance with an embodiment of the invention. Transistors M1 and M2 form a first differential transistor pair that receives a small-swing differential input signal at nodes 105a and 105b. The transistors operate to control differential output signals on nodes a and b. A first current source 300 is positioned between ground and the common node 302 of the differential transistor pair.

The clock output amplifier circuit 120 also includes a second differential transistor pair with input nodes that receive differential error input signals at nodes 115a and 115b. The output nodes of the second differential transistor pair are also connected to nodes a and b. The second differential transistor pair alters the common mode levels of the output nodes a and b based on the differential error input signals to condition the duty cycle of the signal on the output nodes. A second current source 304 is connected between ground and the common node 306 of the second differential pair.

A load circuit comprising PMOS transistors M3, M5, M6, and M4 provides a high impedance load between the output nodes a and b, and a low impedance between Vdd and the output nodes a and b. Transistors M7, M8, M9, and M10 operate as a differential single-ended converting amplifier for the signals from nodes a and b. In particular, the converting amplifier amplifies and converts the differential signal form output nodes a and b into a single ended signal that constitutes the output of the duty cycle correcting amplifier 120.

Those skilled in the art will appreciate that the circuit 120 provides the following features: (1) low power, (2) low inherent distortion, and (3) amplification from small-swing to CMOS levels. The circuit 120 amplifies an input signal sufficiently to permit removal of the buffer stages and merge the small-swing-to-CMOS converter with the duty cycle correction amplifier 110. Any one of many known duty cycle correction circuits 110 may be used in connection with the invention. Placing the converter in the duty cycle correction circuit 110 reduces the power required by the amplification circuit 120.

The input loads, M3, M4, M5, and M6 are MOS devices leading to reduced inherent duty cycle distortion over process, voltage, and temperature. Due to the impedance cancellation of transistors M5 and M6, the small-signal voltage gain from the inputs to nodes a and b can be shown to be $$A_v = g_{mn} R_a$$

where $g_{mn}$ is the transconductance of M1 and $R_a$ is the small signal impedance at node a, which is equal to the small signal impedance at node b. From nodes a and b to nodes c and d amplification is possible through a common source amplifier with either a self-bias as shown in FIG. 4, or with a fixed bias such as the one shown in FIG. 2. These stages provide additional gain over that of the first stage to increase the overall gain of the circuit and allow the voltage of node "d" to swing full rail and drive an inverter. Because the circuit is MOS only, the inherent duty cycle distortion is quite small. Additionally, the output swings full-rail, thus CMOS gates and logic may be coupled directly to the amplifier at the "out" node 121.

Based upon the small signal models, the gain associated with the circuit of FIG. 4 can be defined as $A_v = g_{mn} * R_a * 2 * g_{mp} * R_d$ where $g_{mn}$ is the transconductance of M1, $g_{mp}$ is the transconductance of M7, $R_a$ is the small signal impedance at node $a_g$ and $R_d$ is the small or signal impedance at node d in FIG. 4 and where $R_a$ is equal to $R_b$. The factor of two is present due to the current mirror formed by M10 and M8.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In the claims:

1. A duty cycle correcting amplifier, comprising:
    a first differential transistor pair with a pair of input nodes for receiving a differential input signal to be amplified, said first differential transistor pair having a first common node and a first pair of output nodes carrying differential output signals;
    a first current source connected between said first common node and a first supply voltage;
    a second differential transistor pair having a pair of input nodes for receiving differential error input signals, said second differential transistor pair having a second common node and a second pair of output nodes coupled to said first pair of output nodes, said second differential transistor pair altering the common mode levels of each of said first pair of output nodes based on said differential error input signals to affect the duty cycle of said differential output signals;
    a second current source connected between said second common node and said first supply voltage;
    a load circuit connected between said first pair of output nodes and a second supply voltage, said load circuit providing a high impedance load between each node of said first pair of output nodes and a low impedance between each node of said first pair of output nodes and said second supply voltage;
    capacitive circuitry connected to each node of said first pair of output nodes; and
    a converting amplifier having a pair of inputs for receiving said differential output signals, said converting amplifier amplifying and converting said differential output signals to a single ended signal constituting the output of said duty cycle correcting amplifier.

2. The duty cycle correcting amplifier of claim 1 wherein said load circuit includes a set of PMOS transistors connected between said first pair of output nodes and said second supply voltage.

3. The duty cycle correcting amplifier of claim 1 in combination with a dynamic memory.

4. An amplifier, comprising:
    a first transistor coupled between a first internal node and a first supply voltage, said first transistor being controlled by a signal received at a first amplifier input node;
    a second transistor coupled between a second internal node and said first supply voltage, said second transistor being controlled by a signal received at a second amplifier input node;
    a third transistor coupled between a second supply voltage and said first internal node, said third transistor being controlled by a signal received at said first internal node;
    a fourth transistor coupled between said second supply voltage and said second internal node, said fourth transistor being controlled by a signal received at said second internal node;
    a fifth transistor coupled between said second supply voltage and said first internal node, said fifth transistor being controlled by a signal received at said second internal node;
    a sixth transistor coupled between said second supply voltage and said second internal node, said sixth transistor being controlled by a signal received at said first internal node; and
    a converting amplifier connected to said third, fourth, fifth, and sixth transistors to convert differential signals from said third, fourth, fifth, and sixth transistors to a single ended output signal.

5. The amplifier of claim 4 further comprising:
    a seventh transistor coupled between said first internal node and said first supply voltage, said seventh transistor being controlled by a first error signal received at a first error signal input node of said amplifier; and
    an eighth transistor coupled between said second internal node and said first supply voltage, said eighth transistor being controlled by a second error signal received at a second error signal input node of said amplifier.

6. The amplifier of claim 4 wherein said third, fourth, fifth, and sixth transistors are PMOS transistors.

7. The amplifier of claim 4 wherein a current source is coupled between said first and second transistors and said first supply voltage.

8. The amplifier of claim 5 wherein a current source is coupled between said seventh and eighth transistors and said first supply voltage.

9. The amplifier of claim 4 in combination with a dynamic memory.

* * * * *